United States Patent [19]

Roemer

[11] Patent Number: 4,926,125
[45] Date of Patent: May 15, 1990

[54] SURFACE GRADIENT ASSEMBLY FOR HIGH SPEED NUCLEAR MAGNETIC RESONANCE IMAGING

[75] Inventor: Peter B. Roemer, Schenectady, N.Y.

[73] Assignee: General Electric Company, Schenectady, N.Y.

[21] Appl. No.: 234,729

[22] Filed: Aug. 22, 1988

[51] Int. Cl.$^5$ ............................................. G01R 33/20
[52] U.S. Cl. ................................................... 324/318
[58] Field of Search ................................. 324/318, 322

[56] References Cited

U.S. PATENT DOCUMENTS

| | | | |
|---|---|---|---|
| 4,165,479 | 8/1979 | Mansfield | 324/0.5 A |
| 4,451,788 | 5/1984 | Edelstein et al. | 324/309 |
| 4,638,253 | 1/1987 | Jaskolski et al. | 324/318 |
| 4,646,024 | 2/1987 | Schenck et al. | 324/318 |
| 4,667,174 | 5/1987 | MacKinnon et al. | 324/318 |
| 4,737,716 | 4/1988 | Roemer et al. | 324/319 |
| 4,791,370 | 12/1988 | Mackinnon | 324/318 |

Primary Examiner—Michael J. Tokar
Attorney, Agent, or Firm—Geoffrey H. Krauss; James C. Davis, Jr.; Marvin Snyder

[57] ABSTRACT

A novel surface gradient assembly for high-speed, high-resolution NMR imaging has at least one substantially planar gradient coil. Each of the planar coils is disposed substantially parallel to any other planar coil of the assembly, and in a chosen plane of two selected Cartesian coordinates. Thus, one or more, planar coils lying in, say, the XZ plane can provide a magnetic gradient field in 1, 2 or all 3 of the X, Y and/or Z directions. Each coil can be formed of 1, 2, 4 or more windings, each of which is a "fingerprint" coil of configuration established by current-flow stream functions. An RF shield can be placed between the substantially planar gradient coil(s) and a RF antenna, to prevent interaction between the antenna and gradient coils, so that the quality factor (Q) of the RF antenna is not appreciable lowered.

23 Claims, 6 Drawing Sheets

SURFACE GRADIENT ASSEMBLY FOR HIGH SPEED NUCLEAR MAGNETIC RESONANCE IMAGING

BACKGROUND OF THE INVENTION

The present invention relates to a coil assembly for producing a gradient magnetic field useful in nuclear magnetic resonance (NMR) imaging and spectroscopy and, more specifically, to an assembly of at least one essentially planar gradient coil, each for providing a magnetic field gradient having a reduced rise time and increased gradient strength, to especially facilitate high-speed, high-resolution NMR imaging.

In NMR imaging systems currently employed for forming images of internal human anatomy, a patient is placed in a static magnetic field and is subjected to radio-frequency (RF) electromagnetic pulses. The nuclear resonances of the atomic nuclei of the patient are detected with an antenna, to provide information from which an image can be formed of that portion of the patient containing those excited nuclei. If the magnetic field possesses monotonic gradients in each of the three spatial dimensions, the position of the resonating nuclei can be determined. Magnetic resonance spectroscopy, for analyzing properties of the nuclei, utilizes the same phenomena. Typically, a main magnet (generally of superconducting nature) establishes a uniform high-strength magnetic field, upon which linear gradients are superimposed by gradient coils located within the bore of the main magnet. Generally, the gradient coils are comprised of windings etched upon a flexible printed circuit board, which is then curved to form a cylindrical coil. Highly linear coils, for achieving high resolution imaging, can be designed and fabricated as taught in U.S. Pat. No. 4,646,024, issued Feb. 24, 1987, and can be of a self-shielded nature, as taught in U.S. Pat. No. 4,737,716, issued Apr. 12, 1988, for eliminating eddy currents; both of these patents are assigned to the assignee of the present invention, and are incorporated herein in their entirety by reference. In certain applications, such as high-speed NMR imaging of the human heart, utilizing a "blip echo planar" technique, such as described in U.S. Pat. No. 4,451,788, issued May 29, 1984, assigned to the assignee of the present invention and incorporated herein by reference, images can be acquired in about 1/40-th of a second, if magnetic field gradients can be achieved with strengths of about 2 to 3 Gauss/cm. and rise times of about 100 microseconds. For a given gradient strength and rise time, the peak gradient coil power is proportional to the fifth power of the coil size. However, while substantial performance improvements can be realized by reducing the size of the cylindrical coil, with no change in gradient amplifier/coil subsystem power supplies, it will be apparent that the volume within the smaller gradient coil will rapidly decrease, so that high-speed, high-resolution NMR imaging of any appreciable volume becomes extremely difficult. Even if a useful volume is available, the total amount of data collected in a high-speed image is usually less than that for an image acquired over a much longer time interval, typically in the tens of minutes; high-speed images are, thus, generally of lower resolution and/or exhibit poorer signal-to-noise ratio, with respect to a convention NMR image. As a result, high-speed/high resolution NMR imaging presently has more limited applications than normal NMR imaging. It is therefore highly desirable to provide improved gradient magnetic field-forming means which allow the necessary response data for forming an entire image to be obtained in a relatively short time, and (ideally) without substantially modifying the gradient power amplifiers/supplies of a presently-existing typical NMR imaging system.

BRIEF SUMMARY OF THE INVENTION

In accordance with the invention, a novel surface gradient assembly for high-speed, high-resolution NMR imaging comprises at least one substantially planar gradient coil. Each of the planar coils is disposed substantially parallel to any other planar coil of the assembly, and in a chosen plane of two selected Cartesian coordinates. Thus, one or more, planar coils lying in, say, the XZ plane can provide a magnetic gradient field in 1, 2 or all 3 of the X, Y and/or Z directions. Each coil can be formed of 1, 2, 4 or more (generally $2^M$, where M is an integer) windings, each of which is a "fingerprint" coil of configuration established by current-flow stream functions.

In one presently preferred embodiment, an RF shield is placed between the substantially planar gradient coil(s) and a RF antenna, such as a surface coil, to prevent interaction between the antenna and gradient coils, so that the quality factor (Q) of the RF antenna is not appreciable lowered. A special non-solid RF shield is disclosed for preventing flow of gradient-induced eddy currents while maintaining low impedance for RF field currents established by an adjacent RF surface coil antenna.

Accordingly, it is an object of the present invention to provide a novel substantially-planar surface gradient assembly for high-speed, high-resolution NMR imaging and spectroscopy.

This and other objects of the present invention will become apparent upon reading the following detailed description, when considered in conjunction with the associated drawing figures.

BRIEF DESCRIPTION OF THE DRAWINGS

FIGS. 3a and 3b are graphs illustrating the resulting Y-gradient magnetic field, and the resulting image pixels, respectfully, resulting from the use of an assembly with the single planar gradient coil of FIG. 2b and RF shield of FIG. 2a.

DETAILED DESCRIPTION OF THE INVENTION

Figure 1:
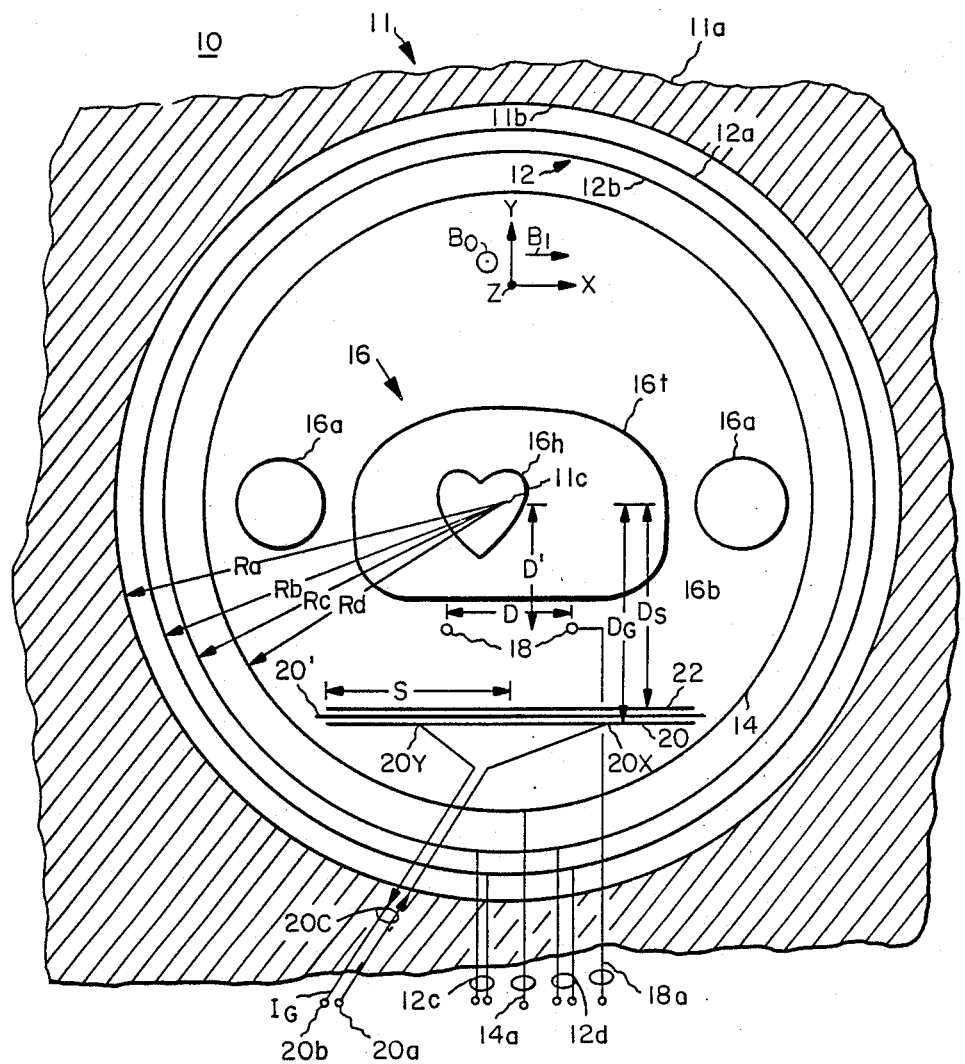
FIG. 1 is a cross-sectional view of a portion of a NMR imaging/spectroscopy system, and useful in understanding the environment in which the gradient assembly of the present invention operates.

Referring initially to FIG. 1, a NMR imaging system 10 utilizes a main magnet 11, of which only a portion 11a is schematically shown; the magnet has an open bore 11b of radius $R_a$ from the bore center 11c. A static main magnetic field $B_O$ is formed within bore 11b. A cylindrical gradient coil means 12 is located within the bore. The gradient-forming means 12 may have an outer portion 12a and an inner portion 12b, as in the self-shielded gradient coils of the aforementioned-mentioned U.S. Pat. No. 4,737,716; the outer gradient coil portion 12a has a radius $R_b$ and the inner gradient coil portion 12b has a radius $R_c$. Gradient coil means 12 may be used to impart 1 or 2 gradients in the main magnetic field, in chosen directions in a Cartesian coordinate system with the remaining one or two gradients being formed by the assembly of the present invention. In another case, all three gradients are formed by the assembly of the present invention and the coil 12 is not used. When coil 12 is used for forming one or more gradient magnetic fields, gradient currents are introduced via one or more cables 12c, 12d and the like. Thus, the main static magnetic field $B_O$, shown as being directed in the axial, or Z, direction is provided with magnetic field gradients by coil 12 and/or by the present invention, as required for a particular procedure.

A radio-frequency (RF) whole body coil 14 may be located within gradient coil 12, and has a radius $R_d$ slightly less than the gradient coil minimum radius $R_c$. While many suitable whole-body RF coils exist, several examples are described and claimed in respective U.S. Pat. No. 4,680,548 or U.S. Pat. No. 4,692,705 or U.S. Pat. No. 4,694,255, respectively issued July 14, 1987, or Sep. 8, 1987, or Sep. 15, 1987, all assigned to the assignee of the present application and incorporated herein in their entireties by reference. A RF magnetic field $B_1$ is provided, say in the X direction, by coil 14 for excitation of nuclei within a sample 16 to be investigated. As shown here, for purposes of illustration, sample 16 is an axial slice through a human subject, with the torso 16t, arms 16a and heart 16h being schematically indicated. In the illustrated situation, an imaging study of heart 16h is to be carried out by a single circular surface coil 18, of diameter D. The surface coil axis (substantially perpendicular to the coil plane) is placed at a distance D', substantially equal to the coil diameter D, from the center of that portion of the sample 16 from which an image is to be obtained. Typically, the more spatially-selective pattern of surface coil antenna 18 is utilized for reception of a NMR response signal from nuclei excited by an excitation signal provided by whole body RF coil, responsive to an RF signal input to cable 14a. The received response signal is provided at a surface coil output cable 18a.

In accordance with the present invention, a gradient coil 20, 20' and the like, is provided for supplying a magnetic field gradient in each of at least one direction, e.g. a Y-axis gradient $G_y$ magnetic field in the Y direction is provided by a first coil 20 responsive to a gradient current $I_g$ caused to flow from a first surface gradient coil terminal 20a to a second coil terminal 20b. The gradient current thus flows through the coil assembly conductors 20c, entering a first planar coil terminal 20X and exiting from a second planar coil terminal 20Y. A second gradient can be provided by another substantially planar coil 20', which, if present, is in a plane substantially parallel to the plane of coil 20'. A third gradient coil would, if used, be placed substantially parallel to the planes of coils 20 and 20'.

RF whole-body coil 14 is usually designed to produce a substantially uniform RF magnetic field $B_1$ in the X and Y directions. The field generated in the X direction is considered a system "mode" which is independent of, and generally different from, the "mode", or field, generated in the Y direction. In general, placement of any conductor, of a length which is long compared to the wavelength at the RF frequency (whether the conductor is in a gradient coil, or otherwise) inside of a high-frequency RF coil will allow electromagnetic waves to be excited on the "long" conductor portions and lead to dissipation loss, reduction in the quality (Q) factor an substantially degradation in the RF coil performance. The RF currents induced in the gradient assembly also tend to distort the total magnetic field and cause a frequency shift in the RF coil itself. RF whole-body coil degradation is minimized, in at least one direction, by configuring the gradient coil to be planar and as thin as practical in that direction. Coil 20, as illustrated, does intercept a portion of the undesired vertical $B_1$ field produced by body coil 14, causing this mode to be detuned. However, the effective area of the planar gradient coil 20, viewed end-on, is so small that the desired horizontal RF mode is virtually unaffected.

In accordance with another aspect of the present invention, a RF shield means 22, also of substantially planar form, is positioned substantially parallel to the plane(s) of the at least one gradient surface coil 20, and at a slightly smaller distance $D_S$ than any of the distances $D_G$ at which one of the planar gradient coils is placed from the bore center 11c; both distances $D_S$ and $D_G$ are greater than the reception surface coil distance D', such that the RF shield member 22 lies between reception antenna 18 and the gradient coil 20 plane, and (typically) in a plane in the direction of RF magnetic field $B_1$.

Figure 1A:
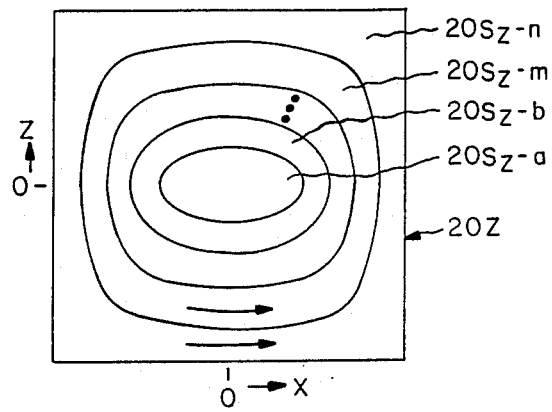
FIGS. 1a, 1b and 1c are schematic plan views of the current contours of one possible set of respective Z-axis, Y-axis and X-axis gradient magnetic field-forming planar coils which can be used in an assembly in accordance with the present invention.

Referring now to FIG. 1a, a planar surface gradient coil 20Z is shown for forming a Z-direction gradient $G_Z$, when the gradient coil is located in the XZ plane. It will be seen that the center of the substantially planar surface gradient coil is located at the $x=0$, $z=0$ coordinate, where x and z define any location within the surface gradient coil plane. Coil 20Z has a plurality n of constant surface current contours $20S_Z$-i, where $a \leq i \leq n$; the innermost constant current contour, or streamline, $20S_Z$-a is of substantially elliptical shape, with the outwardly-successive contours $20S_Z$-b, ..., $20S_Z$-m, $20S_Z$-n having successively more square corners. Arrows indicate the direction of current flow in the adjacent streamlines.

Figure 1B:
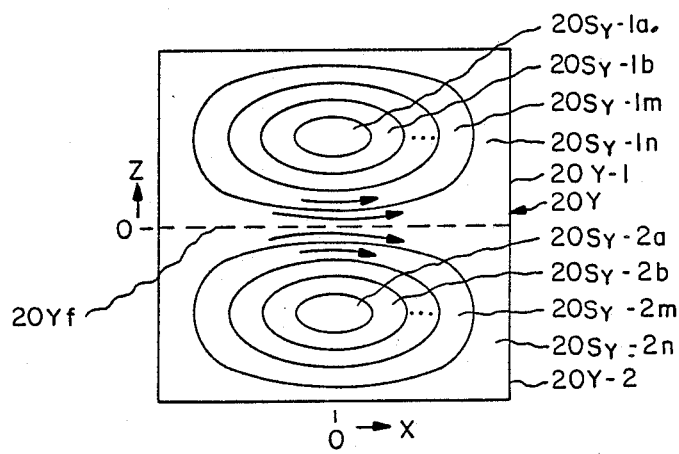

A substantially planar surface gradient coil 20Y, shown in FIG. 1b, provides a Y-direction gradient $G_Y$ with the planar coil situated in the XZ plane. It will be seen that the surface gradient coil 20Y has a pair of essentially identical "fingerprint" coil patterns 20Y-1 and 20Y-2, formed about a central foldline 20-Yf, passing through the center ($x=0$, $z=0$) of the coil plane. The constant current, or stream, contours $20S_Y$-1i and $20S_Y$-2i, for $a \leq i \leq n$, begin with substantially elliptical contours $20S_Y$-1a and $20S_Y$-2a, at the center of their respective half-sheet portions, and progress outwardly through contours $20S_{Y\text{-}1b}, \ldots, 20S_{Y\text{-}1m}, 20S_Y$-1n or $20S_Y$-2b, ..., $20S_Y$-2m, $20S_Y$-2n, with sequentially greater corner-squaring distortion. Arrows indicate the direction of current flow in the two coil portions; note the unidirectionality of current flow in adjacent streamlines on either side of the "imaginary" fold line.

Figure 1C:
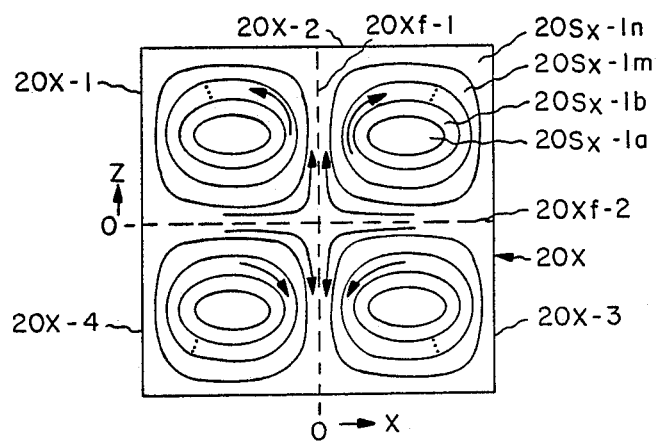

A substantially planar surface gradient coil 20X, shown in FIG. 1c, provides a X-direction gradient $G_X$ with the planar coil situated in the XZ plane. It will be seen that the surface gradient coil 20X has four essentially identical coil patterns 20X-1 through 20X-4, each formed in one of the quarter-plane areas delimited in one of the quarter-plane areas' central foldlines 20-Xf-1 and 20Xf-2, each passing through the center ($x=0$, $z=0$) of the coil plane. The constant current, or stream, contours $20S_X$-1i through $20S_X$-4i, for $a \leq i \leq n$, begin with substantially elliptical stream contours $20S_X$-1a though $20S_X$-4a, at the center of their respective quarter-sheet portions, and progress outwardly through contours $20S_X$-1b, ..., $20S_X$-1m, $20S_X$-1n, or $20S_X$-2b, ..., $20S_X$-2m, $20S_X$-2n, or $20S_X$-3b, ... $20S_X$3m, $20S_X$-3n, or $20S_X$-4b, ..., $20S_X$-4m, $20S_X$-4n, with sequentially greater corner-squaring distortion. Arrows again indicate the direction of current flow; the currents on opposite sides of the fold "lines" 20xf-1 and 20xf-2 will be seen to be in the same direction.

Figure 2A:
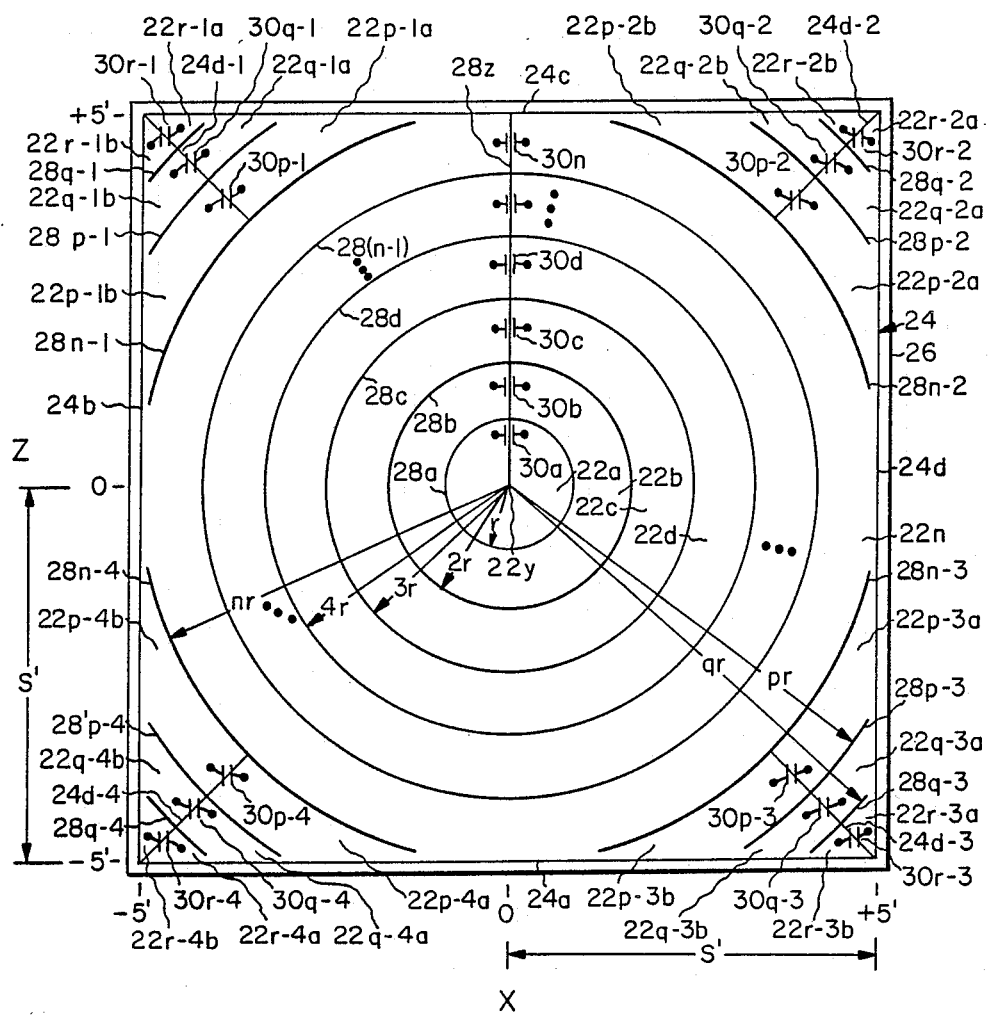
FIG. 2a is a plan view of one presently preferred RF shield utilized with planar gradient coils in the present invention.

Referring now to FIG. 2a, the RF shield 22 may be a patterned conductive sheet 24 supported by a non-conductive substrate 26, such as an etched printed circuit board and the like, and may be of substantially square shape, with each side of conductive sheet 24 having a maximum dimension 2S'. It should be understood that dimension S' may be smaller than, equal to or greater to dimension S, where 2S is the extent of the surface gradient coil, in one of the X or Z directions. The shield conductor pattern is found from a calculation of current streamlines induced in a solid conductive sheet at the shield location. A number of slits are then formed in the conductive sheet, parallel to the current streamlines, to form a series of independent current loops. Each loop is broken at at least one location, and each break is bridged by a capacitor having low impedance at the RF frequency. Sheet 24 is cut by a first groove 28z, which cuts completely through the conductive portion; groove 28z originates at the sheet center 22y and extends to the midpoint of one of the sheet sides (e.g. side 24c). For a circular surface coil, inducing substantially circular currents, each of a plurality of circular grooves 28a through 28m cut completely through the conductive sheet 24a; each groove is centered at the $x=0$, $z=0$ sheet center 22y. Each of circular grooves 28a–28m is formed at a different multiple of a basic radial distance r, where $r=S'/n$ and n is an integer greater than 1. Thus, a first circular groove 28a has a radius r, while a second circular groove 28b has a radius 2r, a third circular groove 28c has a radius 3r, a fourth circular groove 28d has a radius 4r, and so forth, until the $(n-1)$-th groove, with a radius $(n-1)r$, the last completely circular groove, is reached. The n-th groove is broken into four separate segments 28n-1 through 28n-4, each at a distance nr, and each subtending an angle somewhat less than 90°, so that the ends of the four segments of groove 28n do not emerge at the conductive sheet edges 24a through 24d. There is thus formed a plurality N of conductive split-ring shapes 22a, 22b, 22c, 22d, ..., 22n, each having a discontinuity, formed by groove 28z, which is bridged by one of a like plurality N of capacitors 30a, 30b, 30c, 30d, ..., 30n. Each of the four remaining corners of conductive sheet 24 is cut by an associated one of grooves 24d-1 through 24d-4, each starting at an associated corner and proceding inwardly at approximately a 45° angle with respect to an adjacent pair of conductive sheet sides 24a–24d, until the associated one of grooves 28n-1 through 28n-4 is reached. Additional arcuate groove segments 28p-1 through 28p-4, each at a total distance pr from the coil center 22y, and arcuate groove segments 28q-1 through 28q-4, each at a total distance qr from center 22y, are provided; the total arcuate span of each of these additional grooves 28p-j and 28q-j, where $1 \leq j \leq 4$, is less than that arc which would cut the grooves through to the adjacent conductive sheet sides. A number of additional conductive segments are formed, i.e. juxtaposed segments 22p-ja and 22p-jb, 22q-ja and 22q-jb, and 22r-ja and 22r-jb. The gap between each j-th one of these juxtaposed pairs of conductive arc segments, which gap is caused by the associated one of corner grooves 24d-j, is bridged by an associated one of capacitors 30p-j, 30q-j or 30r-j respectively. Thus, a solid RF conductive shield, which is undesirable since gradient-induced eddy currents would be formed therein, is not utilized. The RF currents, as are induced by a circular surface coil RF antenna placed upon one side of the shield, flow in circular paths through the segmented circular shield patterns. The value of capacitors 30 is chosen to be large enough so that the high-frequency RF currents, at frequencies typically greater than 10 MHz. can flow substantially unattenuated, but the lower-frequency gradient-induced currents (typically at frequencies less than 10 KHz.) charge up the capacitors and are thus greatly attenuated. Therefore, RF shield 22 allows the circular RF currents to flow, but blocks the gradient-induced eddy currents from flowing perpendicularly to the surface coil loops thereunder. It will be understood that a non-square shield can be used and that either shield can be used with an RF coil (surface coil) of non-circular configuration.

Figure 2B:
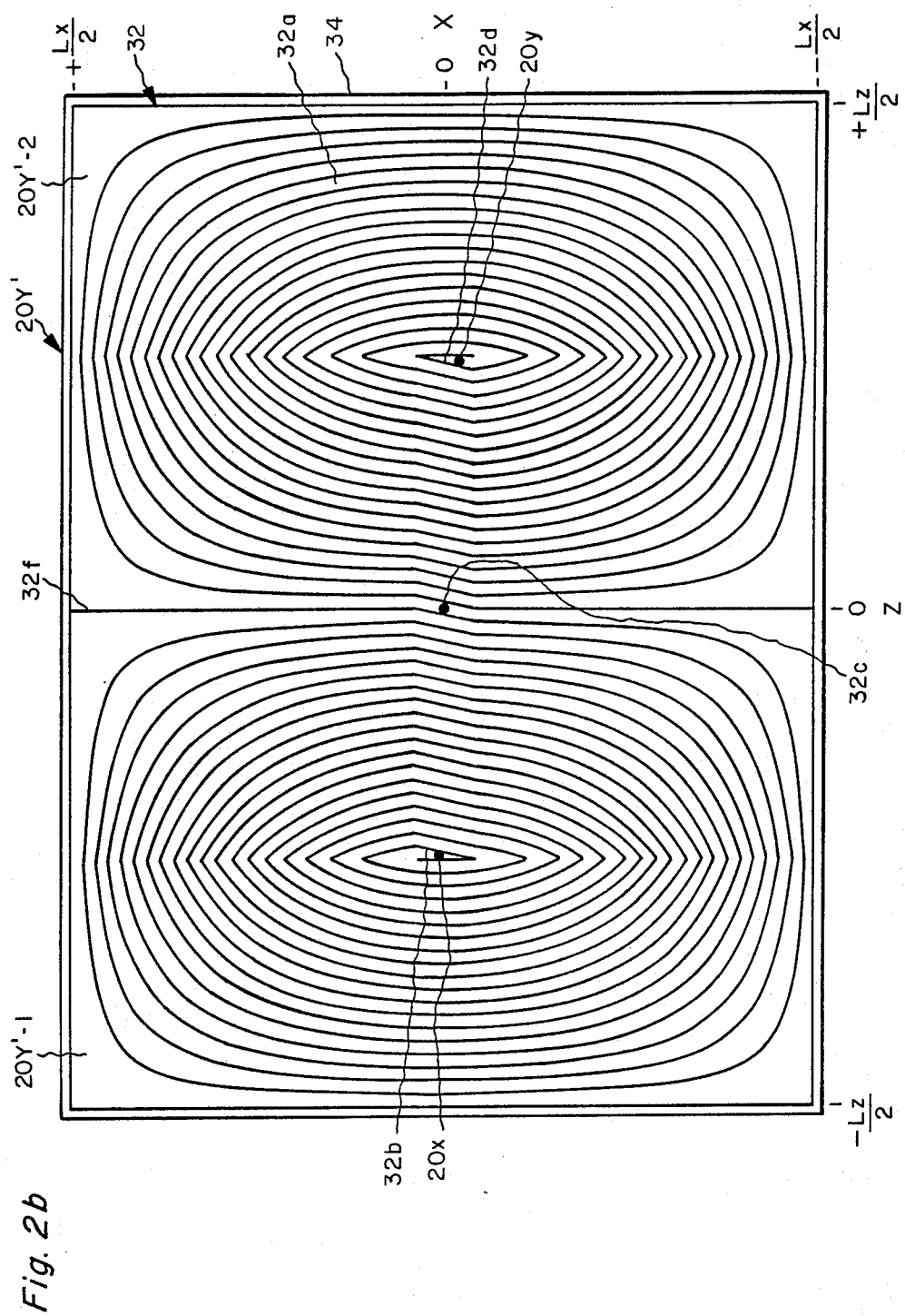
FIG. 2b is a plan view of an etched "fingerprint" planar coil for forming a Y-gradient when the assembly of the present invention is located in the XZ plane.

Referring now to FIG. 2b, a Y-gradient $G_Y$ surface gradient coil 20Y' is illustrated, for forming a high-amplitude, rapid rise-time gradient field in the readout Y direction only, for use in a blip-echo-planar pulse sequence. The self-shielded cylindrical gradient coil 12 is utilized for providing the X and E gradients $G_x$ and $G_z$, responsive to X-axis gradient currents provided to first coil input 12c and Z-axis gradient currents provided to second coil input 12d. In this illustrated scenario, only the gradient in the third mutually-orthogonal direction (i.e. the Y direction) is provided by a substantially planar surface gradient coil of the present invention. The pair of connected "fingerprint" coils are etched into a conductive sheet 32, supported by a non-conductive substrate 34, such as an etched printed circuit board and the like. The contour of the single conductor 32a starts at a first end portion 32b, at which the first surface gradient coil connection 20x is located. In a first fingerprint coil portion 20Y'-1, the signal conductor 32a then spirals outwardly in a counterclockwise direction, around that central portion 32b until the center 32c (located along a center line 32f) of the sheet is reached. The conductor 32a then reverses direction to spiral inwardly, in a clockwise direction, to form a second fingerprint coil portion 20Y'-2 (which is substantially a rotated-by-180° version of the outwardly-spiraling finger-print coil portion 20Y'-1), until the opposite end portion 32d is reached. The second connection point 22y is located in second end portion 32d. The two fingerprint coil portions 20'-1 and 20Y'-2 thus have a total extent from a coordinate $(-L_x/2)$ to an opposite coordinate $(+L_x/2)$ in the X direction, and a total extent from a coordinate $(-L_z/2)$ to a coordinate ($+L_z/2$) in the Z direction. The particular surface currents of the substantially-planar surface gradient coil are described by means of a stream function, denoted by $S(z, x)$. This stream function S describes a flow in which every region of the flow is free from any sources or sinks (i.e. points where flow is produced or disappears) so that contours of constant S are lines parallel to the flow of current. For the $G_Y$ coil illustrated, the stream function is given by:

$$S(Z,X) = \begin{cases} (-4NI/L_z)z\cos(\pi x/L_x) & \text{for } |z| < L_z/4 \\ (4NI/L_z)(z - L_z/2)\cos(\pi x/L_x) & \text{for } +L_z/4 < z < +L_z/2 \\ (4NI/L_z)(z + L_z/2)\cos(\pi X/L_x) & \text{for } -L_z/2 < z < -L_z/4 \end{cases}$$

The method for finding the desired "fingerprint" coil portion winding pattern, given the desired stream function (above), is described in detail in the aforementioned U.S. Pat. 4,737,716, generally at columns 4 and 5 thereof.

Figure 3A:
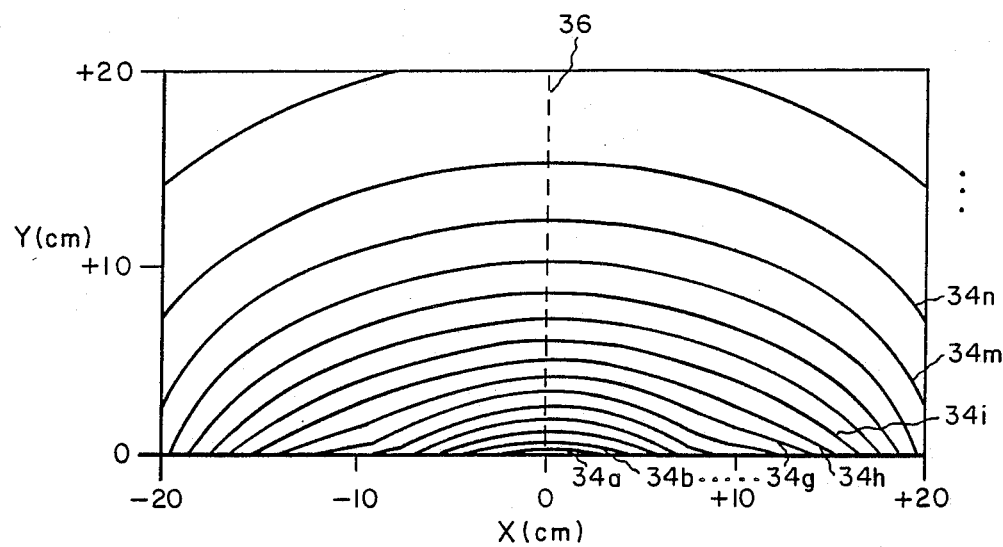
Figure 3B:
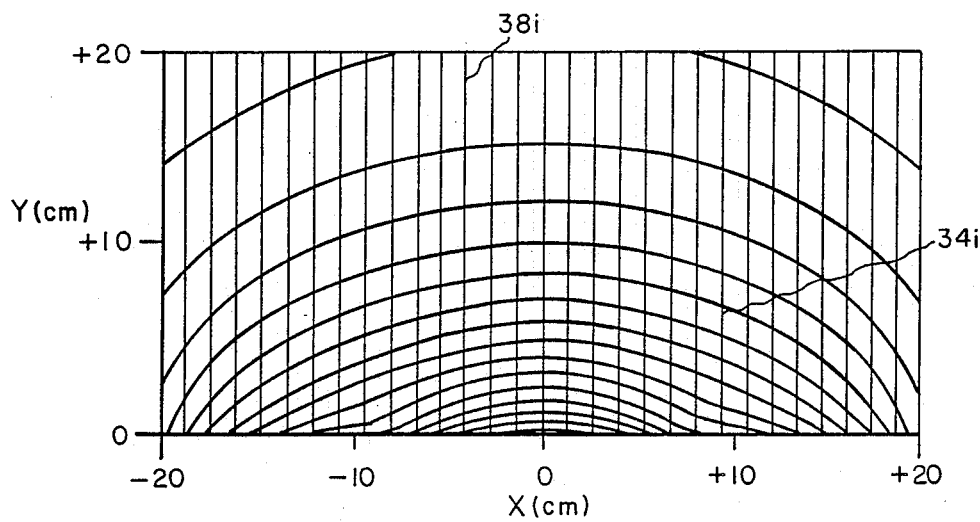
Figure 3C:
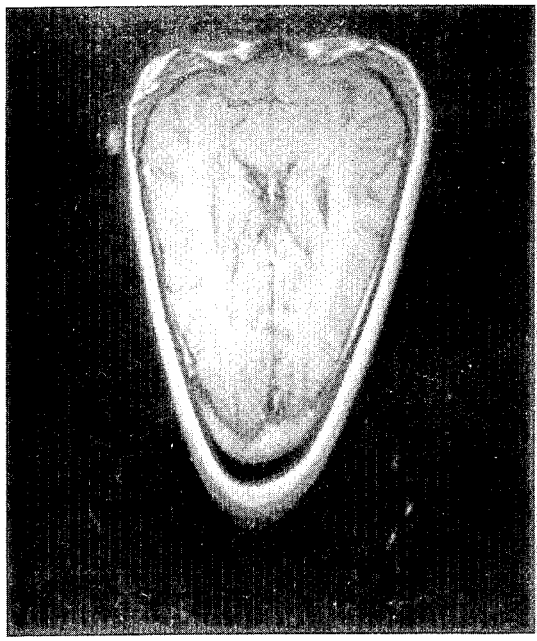
FIGS. 3c and 3d are images of the head of a normal volunteer taken with a surface gradient assembly of the present invention, respectively before and after distortion correction.
Figure 3D:
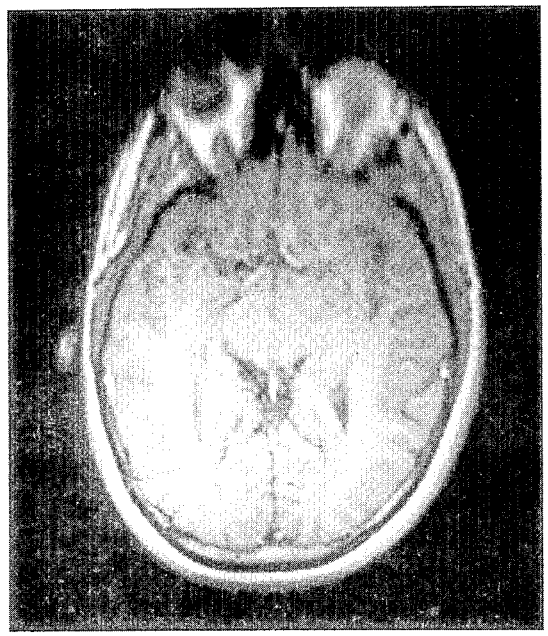

Referring now to FIGS. 3a and 3b, the Y-direction magnetic field gradient $G_Y$ produced by planar surface gradient coil 20Y' is illustrated for contours of constant resonant frequency, in the XY plane. As resonance frequency at any point in space is directly proportional to the total magnetic field at that point, each of resonance curves 34i is also a curve of essentially constant magnetic field gradient. It will be seen that over the ±20 cm span in the X direction and for a distance of up to 20 cm. in the Y direction above the surface gradient coil plane (where y=0), each of the $G_Y$ magnetic field gradient lines 34i is essentially symmetrical about the x=0 axis 36, although the gradient is non-linear (the non-linearity is no great disadvantage since it matches the variation of the sensitivity of surface coil 18 and thus yields a greater resolution where the signal-to-noise ratio is highest). FIG. 3b illustrates the pixels resulting in the XY plane when a volume gradient coil 12 is utilized to provide the substantially X-axis linear gradient $G_x$ lines 38i, in association with non-uniform $G_Y$ gradient lines 34i. The non-uniform pixel size and shape is not particularly disadvantageous, as the distortion effects can be well predicted in advance and a simple remapping of the image, after reconstruction, substantially eliminates all distortion due to the nonlinear y-axis gradient $G_Y$ strength. These effects are clearly illustrated in the NMR images of FIGS. 3c and 3d. The images are of an axial scan through the head of a normal volunteer, as acquired by RF whole-body volume coil excitation and reception of the response signal by a RF surface coil below the rear of the head and in a plane into, and out of, the image; the surface gradient assembly provided only one gradient, in the Y-axis (up-down) direction, with the X (left-right) and Z direction gradients being provided by a self-shielded gradient coil. FIG. 3c shows the image displayed with received response data; Y-axis distortion (shown by lines 34 in FIGS. 3a/3b) is immediately evident. FIG. 3d is the same data, now shown after compensation for the Y-gradient distortion; the elimination of this distortion will be seen, as will the increased resolution in the lower half of the cranial portion of the image.

While presently preferred embodiments of my novel substantially planar surface gradient assembly, for high-speed, high-resolution NMR imaging and spectroscopy, have been described in detail herein, many variations and modifications will now become apparent to those skilled in the art. It is my intent, therefore, to be limited only by the appending claims and not by the specific details and instrumentalities presented by way of explanation of the preferred embodiments herein.

What I claim is:

1. A surface gradient assembly, for providing a magnetic field gradient in a predetermined direction with respect to a plurality of directional axes defining a volume, comprises a single substantially planar gradient coil, lying substantially in a single plane, for generating a gradient magnetic field in said predetermined direction responsive to an externally-provided gradient current.

2. The assembly of claim 1, further comprising at least one additional single substantially planar gradient coil, with each different one of a plurality of gradient magnetic fields, each in the direction of a different axis, being generated by an associated one of a like plurality of the substantially planar gradient coils, each lying substantially in a single associated plane substantially parallel to the plane of each of the other substantially planar coils.

3. The assembly of claim 2, wherein all of the plurality of substantially planar coils are of approximately the same size.

4. The assembly of claim 2, wherein the directional axes are the Cartesian coordinate system axes.

5. The assembly of claim 4, wherein all of the plurality of coils lie in a plane parallel to two selected axes.

6. The assembly of claim 2, further comprising a substantially planar radio-frequency shield member disposed to one side of a resulting stack of the plurality of coils and having its plane disposed substantially parallel to the planes of the stacked coils.

7. The assembly of claim 6, wherein the shield member is configured to substantially prevent eddy current inducement therein responsive to any gradient magnetic field produced by any of the plurality of coils.

8. The assembly of claim 7, wherein the shield member is of approximately the same size as the coils.

9. The assembly of claim 1, wherein the directional axes are the Cartesian coordinate system axes.

10. The assembly of claim 9, wherein the single coil lies in a plane parallel to two selected axes.

11. The assembly of claim 1, further comprising a substantially planar radio-frequency shield member disposed to one side of, and substantially parallel to, the plane of the coil.

12. The assembly of claim 11, wherein the shield member is configured to substantially prevent eddy current inducement therein responsive to the gradient magnetic field produced by the single coil.

13. The assembly of claim 2, wherein each coil is a fingerprint coil having a selected one of 1, 2 and 4 generally-spiral portions of a single conductor adapted to carry a single gradient current from a first coil end to a second coil end and spatially arranged to provide the desired gradient magnetic field responsive to the flow of that single gradient current through the entirety of the single conductor.

14. The assembly of claim 13, wherein the single conductor has a varying width, within the plane of each coil, established by a preselected set of stream functions.

15. The assembly of claim 14, wherein each planar coil has a substantially constant thickness.

16. The assembly of claim 15, wherein each planar coil further includes a non-conductive member underlying and supporting the coil conductor.

17. The assembly of claim 13, further comprising a substantially planar radio-frequency shield member disposed to one side of a resulting stack of the plurality of coils and having its plane disposed substantially parallel to the planes of the stacked coils.

18. The assembly of claim 17, wherein the shield member is a patterned conductive sheet.

19. The assembly of claim 18, further comprising a substantially planar non-conductive member underlying and supporting the shield member conductive sheet.

20. In combination, a radio-frequency (RF) whole-body coil having a central bore volume; and the assembly of claim 1 disposed within said volume.

21. The combination of claim 20, wherein the RF magnetic field of the whole-body RF coil is substantially parallel to the plane of the single gradient coil.

22. In combination, a radio-frequency RF hollow-body coil having a central bore volume; and the assembly of claim 2 disposed within said volume.

23. The combination of claim 22, wherein the RF magnetic field of the whole-body coil is substantially parallel to the common plane of the stacked gradient coils.

* * * * *